United States Patent
Ishikawa et al.

(10) Patent No.: US 6,194,779 B1
(45) Date of Patent: Feb. 27, 2001

(54) PLASTIC MOLD TYPE SEMICONDUCTOR DEVICE

(75) Inventors: Toshimitsu Ishikawa, Yokohama; Kazuichi Komenaka, Kawasaki, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 08/254,667

(22) Filed: Jun. 6, 1994

Related U.S. Application Data

(63) Continuation of application No. 07/920,168, filed on Jul. 27, 1992, now abandoned, which is a continuation of application No. 07/618,896, filed on Nov. 28, 1990, now abandoned.

(30) Foreign Application Priority Data

Nov. 28, 1989 (JP) .................................................... 1-306606

(51) Int. Cl.$^7$ .......................... H01L 23/12; H01L 23/495; H01L 23/498
(52) U.S. Cl. .......................... 257/669; 257/674; 257/676; 438/123; 438/124
(58) Field of Search .................................. 357/68, 70, 72; 257/669, 674, 692, 666, 673, 676

(56) References Cited

U.S. PATENT DOCUMENTS

| | | | |
|---|---|---|---|
| 4,984,059 | * | 1/1991 | Kubota et al. .......................... 357/68 |
| 5,198,883 | * | 3/1993 | Takahashi et al. .................... 257/673 |
| 5,208,481 | * | 5/1993 | Kurita et al. .......................... 257/669 |

FOREIGN PATENT DOCUMENTS

| | | | |
|---|---|---|---|
| 0143355 | * | 8/1984 | (JP) ....................................... 357/72 |
| 0142760 | * | 6/1986 | (JP) ....................................... 357/72 |
| 62-296541 | | 12/1987 | (JP) . |
| 1-007628 | | 1/1989 | (JP) . |
| 0152966 | * | 6/1991 | (JP) .................................. 257/666.3 |

OTHER PUBLICATIONS

Patent Abstracts of Japan, vol. 12, No. 193, Jun. 4, 1988.
Patent Abstracts of Japan, vol. 13, No. 181, Apr. 27, 1989.
2–137250 Abstract of Japanese Laid Open Application, filed May 25, 1990.

\* cited by examiner

*Primary Examiner*—Olik Chaudhuri
*Assistant Examiner*—Alonzo Chambliss
(74) *Attorney, Agent, or Firm*—Foley & Lardner

(57) ABSTRACT

There is disclosed a plastic mold type semiconductor device comprising: a semiconductor chip, leads each having one end portion positioned outside the semiconductor chip in a manner spaced therefrom and the other end portion extending to the portion above the semiconductor chip, and bonding wires for connecting the semiconductor element and the leads, each of the leads being provided with a bonding portion positioned outside of the semiconductor chip. Even if the size of the semiconductor chip and that of the envelope are extremely close to each other, the lead has sufficient length within the molded plastic material so that the lead may not be pulled out.

6 Claims, 1 Drawing Sheet

PLASTIC MOLD TYPE SEMICONDUCTOR DEVICE

This application is a continuation of application Ser. No. 07/920,168, filed Jul. 27, 1992, now abandoned, which is a continuation of Ser. No. 07/618,896, filed on Nov. 28, 1990, now abandoned.

BACKGROUND OF THE INVENTION

This invention relates to a plastic mold type semiconductor device, and more particularly to the connecting structure between the leads and the semiconductor elements.

Sealing or molding in semiconductor devices such as ICs, LSIs, or the like, protects semiconductor chips from pollution sources such as dust, chemicals, gas, moisture, and the like, and avoid mechanical breakages of these elements. As a protective method, hermetic sealing and plastic molding are generally used. Resin or plastic material used in this sealing or molding closely contacts the element surface and completely covers thereover it. Semiconductor devices protected by plastic material or resin are referred to as a plastic mold type semiconductor device.

Semiconductor devices of this kind are known as the DIP (Dual Inline Package) type, in which two rows of lead pins are arranged in parallel: semiconductor devices of the SIL type in which a single row of lead pins is linearly arranged, and the like. A conventional plastic mold type semiconductor device will be described by taking an example of a DIP type semiconductor device.

A semiconductor chip mounted on an element mounting portion at the central portion of a lead frame having a flat smooth surface and front end portions of a plurality of leads arranged so as to surround the element mounting portion are connected by means of bonding wires. Thereafter, by transferring plastic material into a cavity or hollowed portion with the lead frame being held between the upper and lower molds in order that the semiconductor chip is positioned, e.g., at the central portion of the cavity formed on the contact surface of the upper and lower molds to fill the cavity with plastic material, the semiconductor chip mounted on the element mounting portion, bonding wires and inner end portions of leads, etc. are embedded into a plastic mold in a predetermined form and sealed. In this case, the following technique is typically employed. At the peripheral portion of the cavity formed on the contact surface of the upper and lower molds, plastic material filled in the gaps between a plurality of adjacent leads is intercepted by a dam bar surrounding the outer peripheral portion of the cavity at a predetermined interval to connect the plurality of leads. The semiconductor chip is bonded onto the chip mounting portion (bed) by a conductive adhesive agent such as solder, gold, plastic material, etc. After the plastic material is filled in, the lead frame portion located outside of the molded resin is reformed. That is, any unnecessary portion, including the dam bar, is cut off. Thus, a plastic mold type semiconductor device of the DIP type is provided.

In recent years, with high density integration of semiconductor elements, semiconductor chips tend to large in size. On the contrary, not only plastic mold type semiconductor devices, but also semiconductor devices of other types, need to be miniaturized similarly to other electronic parts. Accordingly, the package size is maintained at an existing size, or must be as small as possible. As a result, the size of the package becomes extremely close to that of the semiconductor chip, so the inner lead portion of the lead (which indicates the front end portion close to the element of the lead, and is ordinarily sealed with a molded plastic material) cannot take a sufficient molding length within the molded plastic material. For this reason, since the strength cannot be increased, troubles may occur, such that leads are drawn or pulled out during the process succeeding formation of mold.

To reduce occurrences of such troubles, an arrangement is proposed to elongate the inner lead up to the portion above the semiconductor chip. When the lead is so arranged, the portion coated with the molded plastic material is elongated.

However, even in employing this structure, since the inner lead portion is positioned above the chip, it may be easily moved toward the surface of the chip, even if only a small force is applied thereto. During the wire bonding process, the inner lead portion of the lead is pressed toward the semiconductor chip at the time of bonding. At this time, if there is any foreign substance such as dust on the semiconductor chip, such foreign material will be put between the semiconductor chip and the inner lead portion, with the result that the semiconductor is scratched or damaged due to the pressure on the upper surface of the inner lead at the wire bonding. Where the substrate of the semiconductor chip is silicon, a silicon particle is assumed present.

SUMMARY OF THE INVENTION

Accordingly, an object of this invention is to provide a plastic mold type semiconductor device such that the inner lead can take a sufficient molding length within the molded plastic material even if the size of the semiconductor chip approaches the size of the package, thus making it possible to prevent the lead from being pulled out, the semiconductor device being free from the damage of the semiconductor chip produced, resulting from the fact that any foreign material is put between the inner lead and the semiconductor chip at the time of wire bonding.

According to the present invention, there is provided a plastic mold type semiconductor device comprising a semiconductor chip, leads and bonding wires for connecting the semiconductor element and the leads, characterized in that the each lead has one end portion positioned outside the semiconductor chip in a manner spaced therefrom and the other end portion extending to the portion above the semiconductor chip, and that each of the leads is provided with a bonding portion at a portion positioned outside of the semiconductor chip.

In accordance with the plastic mold type semiconductor device according to this invention, even if the size of the semiconductor chip and that of the envelope are extremely close to each other, the lead can take a sufficient length within the molded plastic material, avoiding the possibility that the lead may be pulled out. Further, since the bonding portion of the lead is formed at the portion except for the extending portion, i.e., spaced from the portion above the semiconductor chip, the device is free from the damage exerted on the semiconductor chip resulting from the fact that any foreign material is put between the lead and the semiconductor chip and pressed to the upper surface of the inner lead at the time of wire bonding, resulting in an improved product yield.

DESCRIPTION OF THE PREFERRED EMBODIMENT

A preferred embodiment of this invention will now be described with reference to FIGS. 1 and 2.

Figure 1:
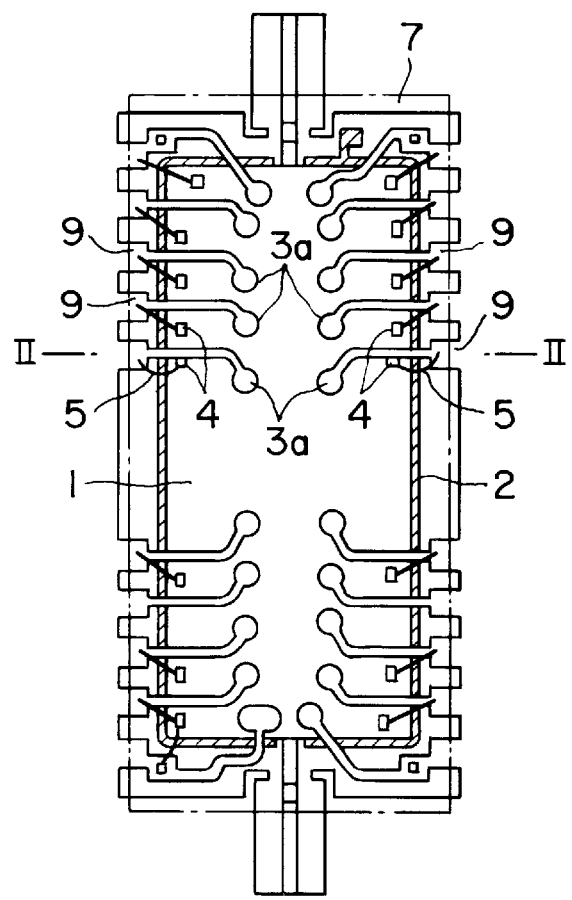
FIG. 1 is a plan view of a plastic mold type semiconductor device of an embodiment according to this invention.
Figure 2:
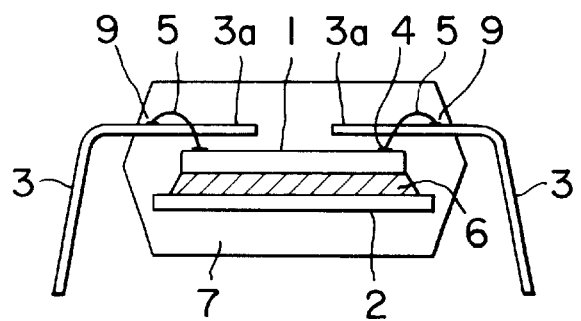
FIG. 2 is a cross sectional view taken along the A–A' line of FIG. 1.

FIG. 1 is a plan view showing a plastic mold type semiconductor device of the DIP type, and FIG. 2 is a cross sectional view taken along the line A–A' thereof.

In this embodiment, in addition to the lead frame, another frame for mounting a chip (hereinafter referred to as a "bed frame") is used. Initially, e.g., a semiconductor chip 1 such as an LSI or DIP is mounted on a chip mounting portion 2 of the bed frame, and is fixed thereon by means of a conductive bonding material 6. As the bonding material, e.g., epoxy resin containing metal powder, solder, or gold, may be used for this purpose. The bed frame is arranged with the side where the chip 1 is provided facing the lead frame. By holding and fixing the both frames as they are, inner lead portions 3 of leads 7 of the lead frame 7 are arranged above the upper surface of the semiconductor chip 1 so as to face the upper element 1. The chip 1 and the leads 3 are electrically connected by bonding wires 5, e.g., gold wires, etc. The bonding wires 5 are connected to bonding pads 4 of the semiconductor chip 1 and the bonding portions 9 of the leads 3, respectively.

The inner end portion 3a of the inner lead portion of each lead 3 is bent and widened to take a circular form.

For connection of the leads 3 and the bonding pads 4, any wire bonding method suitably selected from; the wire bonding method implemented with applying load and ultrasonic wave energy to the object to be connected, which is usually used in the case where the bonding wire is an aluminum wire, and is ordinarily implemented at an ordinary temperature; the thermo-compression bonding method, which is chiefly used for gold wire, in which wire bonding is carried out by utilizing pressure and heat, the ultrasonic wave; and thermo-compression bonding method utilizing pressure, heat and ultrasonic vibration, and the like, may be used.

Irrespective of the method selected, since the bonding portion 9 of the leads 3 are offset from the portion above the semiconductor chip 1, even if any bonding portion 9 is pressed downwardly, there is no possibility that the bonding portions 9 become close to the chip 1 to an extent that harm is caused to the chip 1 because the bonding portion 9 are spaced from the semiconductor chip 1. Further, there is no possibility that the front end portions 3a of the leads above the chip come too close to the chip.

After the wire bonding process is completed, the process step shifts to the process for implementing plastic molding of the semiconductor chip.

As included in the plastic molding method, there are the potting method, the transfer molding method, the casting method, and others. An arbitrary method may be selected. In this embodiment, the transfer molding method of low cost and excellent mass-productivity is used. Although this method requires an initial investment for equipment, plastic molds of a constant quality can be mass-produced without damaging the wires, the frames or the semiconductor chips, if the pouring of plastic into a metal mold is slowly carried out. In a more practical sense, there is implemented a method of allowing powdered plastic material or plastic material in the form of tablets to be melted by applying temperature and pressure, to pour it into the metal mold to solidify it. As the plastic material, e.g., an epoxy resin is used. As the curing or hardening agent, an agent of acid anhydride, amine, or phenol, etc. may be used. In this case, the molding condition is as follows; temperature of about 160 to 180° C., pressure of about 49 to 98 MPa, and molding time of about 60 to 120 seconds. Thereafter, post curing is carried out for several hours at a temperature of about 150 to 180° C. Thus, the plastic molding process is completed.

After the plastic molding process is completed, plastic material burr produced on the lead frame in implementation of this process is removed by suitable means. Then, processing such as solder-plating, etc. is implemented to the lead frame, and lead processing, etc. is carried out. Thus, a plastic mold type semiconductor device of the DIP type is completed.

While explanation has been given in connection with the plastic mold type semiconductor device of the DIP type in the above-described embodiment, this invention is not limited to such an implementation, but is applicable to various semiconductor devices such as the semiconductor device of the SIL type, etc.

In addition, while the front end portion of the inner lead is formed circularly at the inside thereof in the above-described embodiment, this invention is not limited to such an implementation. As long as the inner lead is of a structure enlarged in width, pulling-out of the inner lead is advantageously prevented.

What is claimed is:

1. A plastic mold type semiconductor device comprising:
   a bed of a lead frame;
   a semiconductor chip having electrodes on the periphery of an upper surface thereof, said semiconductor chip being supported by the bed and having an edge defining one end of said semiconductor chip, said edge being substantially perpendicular with respect to said upper surface;
   a mold body in which said semiconductor chip is sealed, said mold body having an interior region defined within said mold body, said interior region being further defined by an upper region above said semiconductor chip and a lower region below said semiconductor chip, said upper region being further defined by a first upper region and a second upper region contiguous with said first upper region and abutting said first upper region along a plane passing through said edge of said semiconductor chip, wherein said plane is perpendicular with respect to said upper surface of said semiconductor surface, and said first upper region extends exteriorly with respect to said semiconductor chip and said second upper region extends above said semiconductor chip;
   leads, each having an outer lead portion projecting from said mold body and an inner lead portion extending into the upper region of said mold body spatially apart from the upper surface of said semiconductor chip within said mold body, said inner lead portion extending through both said first upper region and said second upper region; and
   bonding wires for connecting said electrodes of said semiconductor chip to corresponding points on said inner lead portions, said points being located in said first upper region in a location exterior of said semiconductor chip and spatially apart from said semiconductor chip.

2. The semiconductor device of claim 1, wherein the electrodes include both power and signal transferring electrodes.

3. The semiconductor device of claim 1, wherein an inner end of each of said inner lead portions has an enlarged portion to increase a pull-out resistance of said leads.

4. The semiconductor device of claim 3, wherein each of the enlarged portions has a circular shape.

5. The semiconductor device of claim 1, wherein each said outer lead portion has a downward bent portion with respect to said semiconductor chip.

6. The semiconductor device of claim 4, wherein the enlarged portions are located at an end of said corresponding inner lead that is in said second upper region.

* * * * *